United States Patent
Mitamura (10) Patent No.: US 6,387,012 B1
(45) Date of Patent: *May 14, 2002

(54) METAL COMPLEX SOLUTION, PHOTOSENSITIVE METAL COMPLEX SOLUTION, AND METHOD FOR FORMING METALLIC OXIDE FILMS

(75) Inventor: Satoshi Mitamura, Shinjuku-Ku (JP)

(73) Assignee: Dai Nippon Printing Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/275,038

(22) Filed: Mar. 24, 1999

Related U.S. Application Data (63) Continuation of application No. 08/950,188, filed on Oct. 14, 1997, now abandoned.

(30) Foreign Application Priority Data

Oct. 14, 1996 (JP) .............................. 8-289055
Dec. 28, 1996 (JP) .............................. 8-357857
Mar. 24, 1997 (JP) .............................. 9-87198

(51) Int. Cl.⁷ .............................. B05D 3/02; B05D 3/06
(52) U.S. Cl. ...................... 477/553; 427/558; 427/526; 427/524; 427/100; 438/3; 438/609
(58) Field of Search ................. 427/553, 555, 427/557, 558, 226, 581, 559, 100; 438/608, 609, 3

(56) References Cited

U.S. PATENT DOCUMENTS

| | | | |
|---|---|---|---|
| 3,615,457 A | 10/1971 | Selbert et al. | 430/198 |
| 3,852,074 A | 12/1974 | Rosenberg | 430/198 |
| 4,444,801 A * | 4/1984 | Hongo et al. | 427/555 |
| 4,463,073 A * | 7/1984 | Miyauchi et al. | 427/555 |
| 4,713,518 A * | 12/1987 | Yamazaki et al. | 427/164 |
| 4,937,208 A | 6/1990 | Yamamoto | 501/12 |
| 4,952,556 A * | 8/1990 | Mantese et al. | 427/558 |
| 5,019,146 A | 5/1991 | Hara | 65/18.1 |
| 5,100,764 A | 3/1992 | Paulson et al. | 430/311 |
| 5,156,884 A * | 10/1992 | Tonitsu et al. | 427/558 |
| 5,230,970 A * | 7/1993 | Atwood et al. | 427/555 |
| 5,348,775 A * | 9/1994 | Lin | 427/555 |
| 5,378,508 A * | 1/1995 | Castro et al. | 427/581 |
| 5,403,368 A | 4/1995 | Takahashi et al. | 65/17.2 |
| 5,403,616 A * | 4/1995 | Hattori et al. | 427/126.3 |
| 5,413,959 A * | 5/1995 | Yamamoto et al. | 427/555 |
| 5,449,534 A * | 9/1995 | Oishi et al. | 427/581 |
| 5,500,077 A | 3/1996 | Nishibayashi et al. | 156/628.1 |
| 5,534,312 A * | 7/1996 | Hill et al. | 427/558 |
| 5,560,957 A * | 10/1996 | Johnson | 427/226 |
| 5,605,723 A * | 2/1997 | Ogi et al. | 427/581 |
| 5,650,362 A * | 7/1997 | Nashimoto | 427/100 |
| 5,942,376 A * | 8/1999 | Uchida et al. | 427/558 |
| 5,943,580 A * | 8/1999 | Ramakrishnan | 438/381 |
| 5,989,945 A * | 11/1999 | Yudasaka et al. | 438/609 |
| 6,133,050 A * | 10/2000 | Azuma et al. | 427/558 |
| 6,171,934 B1 * | 1/2001 | Joshi et al. | 438/469 |
| 6,225,656 B1 * | 5/2001 | Cuchiarp et al. | 453/3 |

FOREIGN PATENT DOCUMENTS

| | | |
|---|---|---|
| JP | 63-293178 | 11/1988 |
| JP | 01-222061 | 9/1989 |
| JP | 07-282653 | 10/1995 |

* cited by examiner

*Primary Examiner*—Marianne Padgett
(74) *Attorney, Agent, or Firm*—Parkhurst & Wendel, LLP (57) ABSTRACT

A metal complex solution comprising an organic solvent, and a complex composed of an organic acid salt of at least one metal and an organic amine or organic ketone compound, dissolved in the organic solvent; a photosensitive metal complex solution comprising the metal complex solution, and a photosensitive resin added to the solution; and a method for forming metallic oxide films, using these solutions.

3 Claims, 1 Drawing Sheet

METAL COMPLEX SOLUTION, PHOTOSENSITIVE METAL COMPLEX SOLUTION, AND METHOD FOR FORMING METALLIC OXIDE FILMS

This is a Continuation of application Ser. No. 08/950,188 filed Oct. 14, 1997, now abandoned.

BACKGROUND OF THE INVENTION

1. Field of the Invention

The present invention relates to a metal complex solution, to a photosensitive metal complex solution, and to a method for forming metallic oxide films (including patterned metallic oxide films).

2. Background Art

Metallic oxides have attracted attention from old times due to their thermal, optical, electrical, magnetic and mechanical properties, and conventionally have been applied to various uses in the field of industry. Especially in the field of recent electronic materials, transparent conducting films are used as antistatic materials, materials for heat ray cut-off filters, materials for ultraviolet light cut-off filters, magnetic-wave-shielding materials, materials for transparent electrodes to be used for liquid crystal displays, plasma displays, etc., and materials for producing deicing heaters to be used for window glasses, etc. Further, a variety of metallic oxide films are utilized for those uses which require neither transparency nor electrical conductivity.

Indium oxide/tin oxide (ITO) films have been known as being typical of the above-described transparent conducting films. These metallic oxides can readily form transparent films on glass or ceramic substrates to give transparent conducting films. As methods for forming such transparent conducting films, there have been known, for example, the sputtering process and the sol-gel process. Further, for those uses which require neither transparency nor electrical conductivity, a variety of metallic oxide films are formed by these processes.

The above-described conventional sputtering process is disadvantageous from the view points of production cost and mass-productivity because the film deposition system for use in this process is complicated and also expensive. In order to solve these problems, there have been proposed various methods of application utilizing the so-called sol-gel process, typically a method as described, for example, in Japanese Patent Publication No. 46402/1991. However, those metallic oxide films, especially transparent conducting films which are formed by these methods of application are still insufficient in their qualities. Namely, there are such practical problems that the qualities of the metallic oxide films are unsatisfactory and that, since the transparent conducting films formed have high electrical resistance, they cannot be used for electrodes or the like to be used for display elements, etc. when electrical conductivity is taken into consideration.

Further, as a method for forming patterns in the above-described metallic oxide films or transparent conducting films, there has been known a so-called photolithographic method which comprises a series of complicated steps of providing a resist layer on a metallic oxide film or transparent conducting film formed by the aforementioned sputtering or sol-gel process, subjecting the resist layer to mask-pattern-wise exposure and to development, etching the metallic oxide film or transparent conducting film, and removing the resist layer.

The above-described conventional method for forming patterned metallic oxide films or transparent conducting films is a complicated and long process consisting of two film-forming steps of forming a metallic oxide film or transparent conducting film and a resist layer, one step of exposure, and three wet chemical conversion treatment steps of developing the resist layer, removing the same, and etching the metallic oxide film or transparent conducting film. This method is thus disadvantageous when considering production cost and non-defective rate.

An object of the present invention is therefore to provide a metal complex solution or photosensitive metal complex solution with which a high-quality metallic oxide film, or a transparent conducting film, such as an ITO film, having low electrical resistance and high transparency can be formed on a substrate by the above-described method of application utilizing the so-called sol-gel process, and to provide a method for forming metallic oxide films.

SUMMARY OF THIS INVENTION

In order to attain the foregoing object, the present invention provides a metal complex solution comprising an organic solvent, and a complex composed of an organic acid salt of at least one metal and an organic amine or organic ketone compound, dissolved in the organic solvent; and a photosensitive metal complex solution comprising the metal complex solution, and a photosensitive resin added thereto. Further, the present invention provides a method for forming a metallic oxide film, comprising the steps of coating the above-described metal complex solution onto a heat-resistant substrate, drying the coating to form a film, and heat-treating the film to obtain a metallic oxide film. Furthermore, the present invention also provides a method for forming patterned metallic oxide film, comprising the steps of coating the above-described photosensitive metal complex solution onto a heat-resistant substrate, drying the coating to form a film, subjecting the film to pattern-wise exposure, and developing the exposed film.

According to the present invention, it becomes possible to form high-quality metallic oxide films, or transparent conducting films, such as ITO films, having low electrical resistance and high transparency on substrates by a method of application utilizing the so-called sol-gel process.

DETAILED DESCRIPTION OF THE INVENTION

By referring to the following embodiments, the present invention will be explained in greater detail.

A metal complex solution of the present invention comprises an organic solvent, and a complex composed of an organic acid salt of at least one metal and an organic amine or organic ketone compound, dissolved in the organic solvent. In a preferred embodiment of the present invention, the metal complex solution further comprises a metal alkoxide, and the metal constituting the above-described metal complex is In. Further, it is preferable that the metal of the metal alkoxide be Sn.

For the purpose of obtaining ferroelectric materials, there can be mentioned, as metallic compounds capable of constituting the complex in the invention, organic acid salts or alkoxides of metallic elements constituting metallic oxides such as barium titanate ($BaTiO_3$), strontium titanate ($SrTiO_3$), lead titanate ($PbTiO_3$), zirconium titanate ($ZrTiO_3$), strontium barium titanate ($(Ba, Sr)TiO_3$), lanthanum titanate ($La_2Ti_2O_7$), strontium barium titanate zirconate ($(Ba, Sr)(Ti, Zr)O_3$), lead titanate zirconate ($Pb(Zr,Ti)O_3$), niobium strontium titanate ($(Nb)SrTiO_3$), barium stannate titanate ($Ba(Ti,Sn)O_3$) and yttrium manganate ($YMnO_3$).

Further, for the purpose of obtaining electrically-conductive materials, there can be mentioned organic acid salts or alkoxides of metallic elements constituting metallic oxides such as lanthanum titanate ($LaTiO_3$), tin oxide ($SnO_2$), zinc oxide ($ZnO$), indium zinc oxide ($In_2O_3$—$ZnO$), antimony tin oxide ($SbSnO_2$), indium oxide ($In_2O_3$), zinc tin indium oxide ($(Zn, Sn)In_2O_3$), alumina zinc oxide ($ZnO$—$Al_2O_3$) and gallium zinc oxide ($ZnO$—$Ga_2O_3$).

Furthermore, for the purpose of obtaining optical materials, there can be mentioned organic acid salts or alkoxides of metallic elements constituting metallic oxides such as titanium oxide ($TiO_2$), aluminum oxide ($Al_2O_3$), zirconium oxide ($ZrO_2$), lithium niobate ($LiNbO_3$), lithium iodate ($LiIO_3$), potassium niobate ($KNbO3$), beryllium oxide ($BeO$), lead molybdate ($PbMoO_3$), zinc tungstate ($ZnWO_4$), lead oxide ($PbO$), tungsten oxide ($WO_3$), cobalt oxide ($CoO$) and chromium oxide ($Cr_2O_3$).

For the purpose of obtaining magnetic materials, there can be mentioned organic acid salts or alkoxides of metallic elements constituting metallic oxides such as manganese zinc ferrite ($(Mn,Zn)O.Fe_2O_3$), manganese copper ferrite ($(Mn,Cu)O.Fe_2O_3$), barium ferrite ($BaO.6Fe_2O_3$) and iron oxide ($Fe_3O_4$); and for the purpose of obtaining superconductive materials, there can be mentioned organic acid salts or alkoxides of metallic elements constituting metallic oxides such as YBaCuO oxides.

In the present invention, although the above-enumerated metallic compounds can be used singly, a mixture prepared by mixing two or more of the above metallic compounds depending upon the properties required for a metallic oxide film to be formed can also be used to obtain a composite metallic oxide film.

In the present invention, in order to form a transparent conducting metallic oxide film, it is particularly preferable to use a metal complex solution comprising the following three components:

(a) a complex composed of an organic acid salt of In and an organic amine or organic ketone compound, (b) a Sn alkoxide, and (c) an organic solvent capable of dissolving therein the above two components. The formation of an ITO film, using this metal complex solution will be explained below as a typical example.

The above component (a) is a complex composed of an organic acid salt of In, and an organic amine or organic ketone compound.

This complex can be prepared by reacting an In oxide with an organic acid in a proper organic solvent to obtain an organic acid salt of In, and adding an organic amine or organic ketone compound to this organic acid salt of In.

$In_2O_3$ is typical as the In oxide for use in the above reaction, and it is particularly preferable to use $In_2O_3$ having a high purity, for example, a purity of 99.9% or higher.

Preferable examples of organic acids to be reacted with the above $In_2O_3$ include lower aliphatic carboxylic acids such as formic acid, acetic acid, propionic acid, oxalic acid, maleic acid, monofluoroacetic acid, difluoroacetic acid, trifluoroacetic acid, fumaric acid, 2-methylpropionic acid, butanoic acid, 2-methylbutanoic acid, 2-ethylbutanoic acid, 3-methylbutanoic acid, pentanoic acid, 2-methylpentanoic acid, 2-ethylpentanoic acid, 2-propylpentanoic acid, 3-methyl-pentanoic acid, 3-ethylpentanoic acid and 4-ethylpentanoic acid. In the reaction between $In_2O_3$ and an organic acid, it is theoretical to react them at an equivalent ratio of 1:1. It is however preferable to use the organic acid excessively so that the extra organic acid can serve as a reaction medium. By carrying out the reaction between these two compounds at a temperature of approximately 90 to 150° C. for approximately 2 to 10 hours, a desired organic acid salt of In can be obtained.

Next, an In complex is formed by adding an organic amine or organic ketone compound to the above-obtained organic acid salt of In. It is preferable to form the complex in a high-polar organic solvent so that the complex formed will not separate out.

It is preferable to use, as the organic amine for use in the above step, a lower aliphatic organic amine such as monoethanolamine, diethanolamine, triethanolamine, triethylamine, propylamine, diethylamine or trimethylamine.

A complex containing such an organic amine can be obtained by reacting the above-obtained organic acid salt of In with an organic amine in a polar solvent such as dimethylformamide, dimethylsulfoxide, formamide, ethylene glycol monoethyl ether or ethylene glycol monobutyl ether, at a temperature of approximately 100 to 160° C. for approximately 1 to 4 hours. The amount of the organic amine for use in this reaction is preferably about 1 to 3 moles per 1 mol of the organic acid salt of In. The complex thus prepared is considered to be one in which In+3 and the organic amine are combined with each other at an equivalent ratio of 1:1. It does not matter even if the extra organic amine is remaining in the resulting complex solution.

In the present invention, it is possible to use a β-diketone instead of the above-described organic amine as a substance for forming the complex. Examples of useful β-diketones include acetylacetone, benzoylacetone, benzoyltrifluoroacetone, benzoyldifluoroacetone and benzoylfluoroacetone. The formation of the complex, using a β-diketone may be conducted by the same method as the above-described method for forming the complex, using an organic amine.

An In—Sn complex solution of the present invention can be obtained by adding a Sn alkoxide to the above-prepared In complex solution, and dissolving the alkoxide in the complex solution. Any Sn alkoxide can be used in the present invention as long as at least one of four bonds of Sn atom is combined with an alkoxy group. Examples of such an alkoxy group include methoxy, ethoxy, n-propoxy, isopropoxy, n-butoxy, isobutoxy, glycoxy, caproxy and amyloxy groups.

It is more preferable to use a lower alkoxide such as methoxide, ethoxide, n-propoxide, isopropoxide, n-butoxide or isobutoxide. This is because, when such a lower alkoxide is used, an ITO film articularly excellent in electrical conductivity and transparency can be obtained.

The Sn alkoxide is used in such an amount that the metal atomic ratio of In contained in the In complex to Sn (In:Sn) will be, in general, 10:1. It does not matter if the proportion of either one of these two metals is approximately 75% greater than the proportion shown by this atomic ratio.

By adding a Sn alkoxide to the above-obtained In complex solution, an In—Sn complex solution of the present invention can be obtained. In the present invention, it is preferable to further heat-treat this mixture at a temperature of approximately 80 to 160° C. for approximately 1 to 4 hours. Although the details are unknown, it is considered that complexation further occurs between the In complex and the Sn alkoxide by this heat treatment. Although some precipitates separate out by the heat treatment, the solution is sufficiently stable, and can be stored for a long period of time. By removing, when necessary, the impurities separated, an In—Sn complex solution of the present invention which is substantially transparent can be obtained.

The In—Sn complex solution of the present invention comprises as essential components the above-described components (a) and (b) (or a complexation product of these two components). When this complex solution is coated onto the surface of a substrate, any of various organic solvents which are inactive to the above complexation product can be used to make the complex solution into a coating liquid having a viscosity suitable for coating. Examples of solvents (component (c)) useful for this purpose include polar organic solvents such as alcohol-, dimethylformamide-, dimethyl-sulfoxide-, dimethylacetamide-, ethylene glycol-, diethylene glycol-, glycerin- or tetrahydrofuran-based solvents.

In the present invention, the following additives can be added to the In—Sn complex solution within such a limit that the attainment of the object of the present invention is not obstructed. Thus, at least one metal alkoxide compound selected from the group consisting of alkoxides of metals such as silicon, zinc, aluminum, germanium, gallium, magnesium, titanium, zirconium, yttrium and rare earth elements may be added as a thickening agent for the In—Sn complex solution.

Next, the method for forming transparent conducting films, using the In—Sn complex solution of the present invention will now be explained.

First of all, a coating liquid having a viscosity suitable for coating is prepared by adding the aforementioned organic solvent to the above-described In—Sn complex solution of the present invention. This coating liquid is coated onto the surface of a glass substrate useful for various optical apparatuses, or of a ceramic substrate by any one of known methods of application such as spin, gravure, roll, die, reverse-roll, spray, dip, curtain and bead coating methods, thereby forming a coating. The solvent contained in this coating is thoroughly removed by heating to obtain a film.

The amount of the above coating liquid to be coated onto the substrate varies depending upon the use of a transparent conducting film to be formed. However, this amount is, in general, approximately 0.7 to 40 $g/m^2$ when calculated in terms of solid matter. Specifically, when a transparent conducting film to be formed is used as an antistatic material, heat ray cut-off filter, ultraviolet light cut-off filter or dew-condensation-preventing material, the amount of the coating liquid to be coated, calculated in terms of solid matter is approximately 0.7 to 7.2 $g/m^2$. Further, when the transparent conducting film is used as the transparent electrode of a liquid crystal display, plasma display, etc. or for shielding electromagnetic waves, the amount of the coating liquid to be coated, calculated in terms of solid matter is approximately 0.7 to 36 $g/m^2$.

The film formed is baked at a temperature of approximately 300 to 600° C. for approximately 1 to 3 hours. By this baking, all of the organic materials contained in the film are removed, and, at the same time, the ITO components are crystallized and form a film. Thus, an ITO film which is excellent in both electrical conductivity and transparency is formed.

It is preferable that the transparent conducting film which has been heat-treated as mentioned above be further irradiated with light with wavelengths of 400 nm or shorter, preferably 150 to 400 nm. When the transparent conducting film is irradiated with light with wavelengths longer than 400 nm and 700 nm or shorter, that is, wavelengths in the visible region, the film transmits most of the light. Further, when the transparent conducting film is irradiated with light with wavelengths of longer than 700 nm, the film absorbs the light with a certain wavelength. However, the energy of the light absorbed is low, so that the density of conduction electron in the transparent conducting film cannot be increased.

Furthermore, light with wavelengths of shorter than 150 nm falls in the vacuum ultraviolet region, so that this light is of no utility value in the field of industry. For the above irradiation, it is possible to use a light source using an ultrahigh-, high-, medium- or low-pressure metallic vapor gas, a rare gas, hydrogen, $Xe_2$, Kr—Cl or Xe—Cl, for example, high-pressure mercury vapor lamp or excimer lamp, or a laser such as an excimer laser, a dye laser, Ar ion laser or $F_2$ laser.

More specifically, there can be mentioned Hg—Xe ultraviolet tight lamp (main peak of wavelength=360 nm), low-pressure Hg vapor lamp (main peak of wavelength=254 nm), Kr—Cl excimer lamp (main peak of wavelength=222 nm), an excimer laser utilizing Xe—Cl (308 nm), Xe—F (351 nm), Xe—Br (282 nm), Kr—F (249 nm) or Kr—Cl (222 nm), Ar ion laser second harmonic (257.2 nm), dye laser second harmonic crystal ($\beta$-$BaB_2$ $BO_4$, 205 nm), $F_2$ laser (157 nm), and the like.

By the energy of the light applied to the transparent conducting film, grain boundaries in the film are connected to one another, so that the mobility of conduction electrons in the film is enhanced. The electrical resistance of the transparent conducting film is thus lowered. The level of this energy can be properly decided depending upon the materials used for forming the transparent conducting film, the thickness of the film, the light source to be used, and the intended use of the film.

A photosensitive In—Sn complex solution of the present invention can be prepared by adding, to the aforementioned In—Sn complex solution of the present invention, a photosensitive resin soluble in the complex solution, and dissolving the resin in the solution. The photosensitive resin may be of positive type or of negative type. Examples of positive photosensitive resins include photodisintegrating soluble quinone diazide photosensitive resins. Examples of negative photosensitive resins include photodisintegrating crosslinkable azide photosensitive resins, photodisintegrating insoluble diazo photosensitive resins, photodimerizable cinnamate photosensitive resins, photopolymerizable unsaturated polyester photosensitive resins, photopolymerizable acrylate resins, and cationically-polymerizable resins.

The amount of the photosensitive resin to be added to the above-described In—Sn complex solution is preferably from 140 to 900 parts by weight for 100 parts by weight of solid matter calculated in terms of the oxide concentration of the In—Sn complex solution. When the amount of the photosensitive resin added is too small, the resulting photosensitive In—Sn complex solution is insufficient in photosensitivity. On the other hand, when this amount is too large, the resulting ITO film is poor in quality. It is noted that the solid matter calculated in terms of oxide concentration as used herein is defined as follows:

Solid matter calculated in terms of oxide concentration (g)=(the number of moles of In in In—Sn complex solution)×½×(the formula weight of In$_2$O$_3$)+(the number of moles of Sn in In—Sn complex solution)×(the formula weight of SnO$_2$)

In the method for forming patterned transparent conducting films according to the present invention, the above-described photosensitive In—Sn complex solution is coated onto the surface of a substrate in the same manner as in the above-described formation of an ITO film, and the solvent is removed by drying to form a coating. This coating is subjected to pattern-wise exposure to crosslink the exposed portions of the photosensitive resin for hardening (negative type), or to disintegrate (positive type) the same, thereby forming a latent image. This latent image is developed to obtain a patterned film, which is then baked under the same conditions as in the formation of an ITO film described previously. Thus, a desired patterned transparent conducting film can be obtained. By further irradiating this patterned transparent conducting film with light with wavelengths of 400 nm or shorter, preferably 150 to 400 nm, a patterned transparent conducting film which is more excellent in electrical conductivity can be obtained.

Through the above-described steps, a patterned transparent conducting film (ITO film) accurately corresponding, to the pattern of a photomask used is formed on a substrate. The ITO film thus obtained is excellent in transparency and also in electrical conductivity like ITO films obtainable by the conventional vacuum vapor deposition, sputtering or CDV process. Therefore, according to the present invention, it becomes possible to form patterned transparent conducting films useful for various uses by a simple process without using an expensive system.

In order to conduct the pattern-wise exposure of the above-described coating, it is necessary to select the light to be applied such as electron beam, ultraviolet light or visible light, depending upon the wavelength at which the photosensitive resin used for forming the coating shows sensitivity, and to make the amount of energy to be applied (exposure energy) proper. For example, in Examples of the present invention, in which ultraviolet light is used for exposure, the exposure energy at a wavelength of 405 nm is 15 mW/cm$^2$, and the exposure time is 5 minutes. The exposure energy is a function of apparatus, and depends on the light source of an apparatus to be used for exposure. Therefore, the practical exposure energy is fixed by the exposure time.

In Examples of the present invention, pattern-wise exposure is conducted by using a photoresist to make a difference in solubility to a developer between the exposed portions and unexposed portions on the coating. A fine pattern is thus formed after development. At this time, when the exposure energy is made smaller than the above-described value, it becomes difficult to form a fine pattern. On the other hand, when the exposure energy is made greater than the above-described value, the shape of the edge of the resulting fine pattern is impaired (the edge becomes undulated). As a result, the resolution of the pattern is lowered.

Before developing the coating which has been subjected to the above-described pattern-wise exposure, a developer to be used is properly selected depending upon the photosensitive resin used, and the process conditions such as the concentration of the developer, the development time and the development method are decided.

For example, in Examples of the present invention, an ultraviolet-sensitive novolak positive resist is used as the photosensitive resin, so that a suitable developer is an aqueous alkaline solution. In Examples of the present invention, the concentration of the developer is 0.5% by weight; the development time is 1.5 minutes; and the development method is a dipping method. When the concentration of the developer is made higher than the above concentration, or when the development time is made longer than the above time, or when the development conditions are made severer, for example, when a spraying development method in which physical impact is stronger than that in a dipping method is employed, the resulting patterned film swells as the developer penetrates into the film, so that the resolution of the pattern is lowered or that the film falls off the substrate. On the other hand, when the concentration of the developer is made lower than the above-described concentration, or when the development time is made shorter than the above-described time, or when the development conditions are made milder, it becomes difficult to form a fine pattern.

The present invention has been explained above by referring to the ITO film as a typical example. However, the present invention is not limited to ITO films, and transparent conducting films of other metallic oxides can also be formed by the same method as the above-described method for forming ITO films.

Further, also for those uses which require neither transparency nor electrical conductivity, various metallic oxide films can be formed by the same method as the above.

The present invention will now be explained more specifically by referring to the following Examples and Comparative Examples.

EXAMPLES OF TRANSPARENT CONDUCTING FILMS

Example 1

1. Preparation of In—Sn Complex Solution

A 1,000 ml three-necked flask equipped with a mechanical stirrer, a Dimroth condenser, a thermometer, and silicone rubber stoppers was prepared. The flask was unstoppered, and 3.2 mol of acetic acid was placed in the flask.

0.04 mol of indium oxide (purity: 99.999%) was added to the flask with stirring the acetic acid in the flask, and the temperature of the mixture was raised, with stirring, to 100° C. over a period of 30 minutes by using an oil bath. The mixture was heated under reflux at the temperature for 5 hours, and then cooled to room temperature.

The solution contained in the above flask was transferred to a 500 ml egg-plant type flask, and concentrated to 50.1 g by using a rotary evaporator at a temperature of 70° C. under a pressure of 30 mmHg.

This concentrate was transferred to a 1,000 ml three-necked flask equipped with a mechanical stirrer, a Dimroth condenser, a thermometer and silicone rubber stoppers, and stirred at room temperature. In a 100 ml Erlenmeyer flask, 71 g of imethyliformamide (guaranteed reagent) and 0.08 mol of triethanolamine (guaranteed reagent) were placed, and the mixture was stirred by a stirrer for approximately 20 minutes to obtain a homogeneous solution.

This solution was added to the previously-mentioned condensate contained in the three-necked flask, and the temperature of the mixture was raised, with stirring, to 120° C. over a period of 30 minutes by using an oil bath. The mixture was heated under reflux at the temperature for 2 hours, and then cooled to 40° C., thereby obtaining an In complex solution consisting of In ion, acetic acid and triethanolamine.

To this solution, a Sn-n-butoxide/butanol solution (Sn content: 0.008 mol) was gradually added, with stirring, through the silicone rubber stopper by using a microsyringe.

The temperature of the mixture was then raised, with stirring, to 120° C. over a period of 30 minutes by using an oil bath. The mixture was heated under reflux at the temperature for 30 minutes, and then cooled to room temperature. Thus, an In—Sn complex solution of the present invention, consisting of Sn ion, In ion, acetic acid and triethanolamine was obtained.

The In—Sn complex solution was transferred to a 300 ml egg-plant type flask. In a darkroom, a photosensitive polymer solution ("NPR-9100" manufactured by Nagase Electron Chemicals Co., Ltd., Japan, viscosity=640 cp) was added to the complex solution so that the weight ratio of the In—Sn complex solution to the photosensitive polymer solution would be 3:1, and the mixture was stirred at room temperature for 30 minutes. The resulting solution was filtered through a membrane filter with a pore size of 0.1 μm. Thus, a photosensitive In—Sn complex solution of the present invention was obtained.

2. Formation of Finely-Patterned Transfer Conducting Film

The photosensitive In—Sn complex solution of the present invention prepared in the above-described manner was spin-coated at 700 rpm for 30 seconds onto the surface of a low-alkaline glass plate ("Glass 7059" manufactured by Corning Co., Ltd.) in such an amount that an ITO film having a thickness as shown in Table 1, which will be described later, would be formed. The film formed was preliminarily dried in a circulating clean oven at 100° C. for 20 minutes.

After this preliminary drying, the film was covered with a mask having a resolution test pattern, and exposed to ultraviolet light emitted from an ultraviolet irradiation device (main peak wavelength: 405 nm) under the following conditions: the exposure energy was 31 mW/cm$^2$, and the exposure time was 50 seconds. The exposed film was then dipped in an aqueous solution containing 0.5% by weight of potassium hydroxide for 1.5 minutes for development. The developed film was thoroughly washed with water, and then air-dried. The dried film was baked in an electric oven with keeping the peak temperature of 580° C. for 30 minutes. The substrate with a finely-patterned transparent conducting film was thus finally obtained.

Example 2

A photosensitive In—Sn complex solution of the present invention was prepared in the same manner as in Example 1 except that 0.08 mol of triethanolamine used in Example 1 was replaced with 0.24 mol of acetylacetone. By the use of this complex solution, the substrate with a finely-patterned transparent conducting film was obtained in the same manner as in Example 1.

Example 3

A photosensitive In—Sn complex solution of the present invention was prepared in the same manner as in Example 1 except that 0.08 mol of triethanolamine used in Example 1 was replaced with 0.16 mol of diethanolamine. By the use of this complex solution, the substrate with a finely-patterned transparent conducting film was obtained in the same manner as in Example 1.

Example 4

A photosensitive In—Sn complex solution of the present invention was prepared in the same manner as in Example 1 except that 0.08 mol of triethanolamine used in Example 1 was replaced with 0.24 mol of monoethanolamine. By the use of this complex solution, the substrate with a finely-patterned transparent conducting film was obtained in the same manner as in Example 1.

Example 5

A photosensitive In—Sn complex solution of the present invention was prepared in the same manner as in Example 1 except that 0.08 mol of triethanolamine used in Example 1 was replaced with a solution of 0.24 mol of benzoylacetone in 50 g of absolute alcohol. By the use of this complex solution, the substrate with a finely-patterned transparent conducting film was obtained in the same manner as in Example 1.

Example 6

A photosensitive In—Sn complex solution of the present invention was prepared in the same manner as in Example 1 except that 3.2 mol of acetic acid used in Example 1 was replaced with 1.6 mol of formic acid. By the use of this complex solution, the substrate with a finely-patterned transparent conducting film was obtained in the same manner as in Example 1.

Example 7

A photosensitive In—Sn complex solution of the present invention was prepared in the same manner as in Example 1 except that 3.2 mol of acetic acid used in Example 1 was replaced with 4.0 mol of propionic acid and that the mixture of the propionic acid and indium oxide was heated under reflux at 100° C. for 10 hours. By the use of this complex solution, the substrate with a finely-patterned transparent conducting film was obtained in the same manner as in Example 1.

Example 8

A photosensitive In—Sn complex solution of the present invention was prepared in the same manner as in Example 1 except that the Sn-n-butoxide/butanol solution (Sn content: 0.008 mol) used in Example 1 was replaced with a Sn-tetraethoxide/ethanol solution (Sn content: 0.008 mol). By the use of this complex solution, the ubstrate with a finely-patterned transparent conducting film was obtained in the same manner as in Example 1.

Example 9

By the use of the In—Sn complex solution prepared in Example 1, to which the photosensitive polymer had not been added yet, a non-patterned transparent conducting film was formed.

3. Evaluation of Transparent Conducting Films

The transparent conducting films obtained in Examples 1 to 9 were evaluated in terms of specific resistance, film thickness, and transmittance. The specific resistance was determined by a four-terminal type resistance meter manufactured by Mitsubishi Petrochemical Co., Ltd., Japan. The film thickness was measured by a feeler type film-thickness-measuring apparatus manufactured by Beeko Co., Ltd., Japan. The transmittance was evaluated by a microspectrophotometer manufactured by Nikon Corp., Japan.

It was confirmed by X-ray diffraction patterns that the transparent films obtained in Examples 1 to 9 were ITO films. The results of the above evaluation are shown in the following Table 1.

| | Complex Solution Concentration of | Patterned Transparent Conducting Film (ITO) | | | |
|---|---|---|---|---|---|
| | Metallic Oxides (wt. %) | Specific Resistance (Ω cm) | Film Thickness (μm) | Resolution (μm) | Transmittance (%) |
| Example 1 | 6.75 | 2.2E-1 | 0.20 | 20L&S | 85 or higher |
| Example 2 | 6.20 | 2.5E-1 | 0.18 | 30L&S | 85 or higher |
| Example 3 | 6.52 | 2.8E-1 | 0.17 | 20L&S | 85 or higher |
| Example 4 | 6.62 | 3.2E-1 | 0.19 | 20L&S | 85 or higher |
| Example 5 | 4.32 | 4.9E-1 | 0.12 | 30L&S | 85 or higher |
| Example 6 | 6.75 | 2.1E-1 | 0.23 | 30L&S | 85 or higher |
| Example 7 | 6.75 | 3.6E-1 | 0.21 | 20L&S | 85 or higher |
| Example 8 | 6.68 | 3.1E-1 | 0.23 | 30L&S | 85 or higher |
| Example 9 | 8.98 | 6.2E-1 | 0.21 | — | 85 or higher |

As shown in the above Table 1, the oxide concentrations of the complex solutions of Examples 1 to 9 (calculated in terms of indium oxide and tin oxide) are from 4.32 to 8.98% by weight; and the ITO films formed by using these complex solutions have specific esistances ranging from 6.2E-2 Ωcm to 4.9E-1 Ωcm, film thicknesses ranging from 0.12 to 0.21 μm, and spectral transmittances of 85% or higher (wavelength: 400 to 700 nm). The ITO films thus have electrical conductivity and light-transmitting properties enough for practical use.

Examples 10 to 18

The finely-patterned transparent conducting films obtained in Examples 1 to 9 were respectively irradiated one time with Xe—Cl excimer laser radiation (wavelength: 308 nm) in the atmospheric environment, the irradiation energy being 200 mJ/cm$^2$. Thus, the substrates with finely-patterned transparent conducting films were obtained. The films formed were evaluated by the same methods as those used for the evaluation of the films obtained in Examples 1 to 9. The results are shown in the following Table 2.

Figure 1:
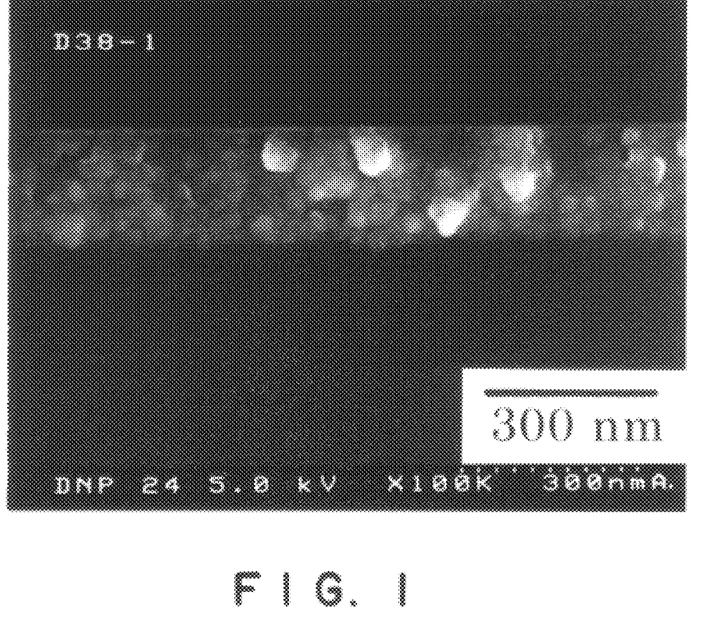
FIG. 1 is an electron micrograph of the cross section of the transparent conducting film of the present invention obtained in Example 1.
Figure 2:
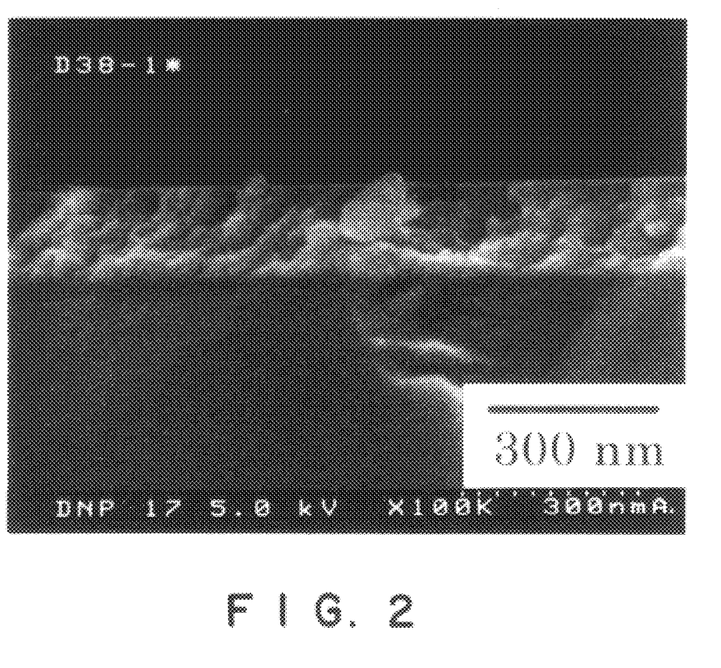
FIG. 2 is an electron micrograph of the cross section of the transparent conducting film of the present invention obtained in Example 10.

As shown in the above Table 2, all of the samples after being irradiated with light with a wavelength shorter than 400 nm (Xe—Cl excimer laser radiation) showed specific resistances lower than those of the samples before being irradiated with the light. Thus, these samples were confirmed to be transparent conducting films more excellent in electrical conductivity. By the measurement utilizing X-ray diffraction, it was found that the peak strength and half band width of each face of any of the samples before being irradiated with the laser were remained unchanged even after the irradiation. It was thus confirmed that the crystallinity of the films was not affected by the irradiation. Further, the fractured surfaces of the films of Examples 1 and 10 were observed by an FE-SEM (field emission type scanning electron microscope). The results are shown in FIGS. 1 and 2. In the film of Example 1, before being irradiated with excimer laser (FIG. 1), there were polycrystalline secondary particles with sizes ranging from 30 to 100 nm. This film was thus found to have many grain boundaries. On the other hand, the film of Example 10, after being irradiated with excimer laser (FIG. 2) was found to be free from the above grain boundaries and to be more homogeneous. It is therefore presumed as follows: since electrical barriers formed by the grain boundaries of the polycrystalline secondary particles were broken by the application of excimer laser radiation, the movement of electric charges became easier, and, as a result, the ITO film of Example 10 showed a lowered specific resistance. In contrast to this, when light with a wavelength longer than 400 nm (He—Ne laser radiation, wavelength: 633 nm) was applied, the decrease in specific resistance was small. Further, no changes were found in both film thickness and transmittance between the samples before and after the laser irradiation.

The resolutions of the fine patterns in the films of Examples 1 to 8, expressed in line & space of the resolution test pattern were from 20 to 30 μm. These values were not changed by the application of the laser radiation. Patterned films with high resolutions, useful for transparent electrodes to be used for liquid crystal displays, plasma displays, etc. can thus be obtained.

It was impossible to form fine patterns in Examples 9 and 18. However, there was obtained a film having a thickness of 0.21 μm, high electrical conductivity (the specific resistance of the film after being irradiated with the laser radiation being 2.2E-3 Ωcm), and high transparency (the transmittance of the film being 85% or higher).

EXAMPLES OF FERROELECTRIC THIN FILMS

It is expected that ferroelectric thin films are applied to pyroelectric sensors, nonvolatile memories and the like. On the other hand, in order to form ferroelectric thin films having high residual polarizations, practically employable for the above devices, it is necessary to considerably severely control the conditions for film formation. In addition, it is needed to study a method for improving fatigue phenomenon (a change in residual polarization during repetitive polarization inversion test), which has been

TABLE 2

| | Complex Solution Concentration of Metallic Oxides (wt. %) | Patterned Transparent Conducting Film (ITO) | | | | |
|---|---|---|---|---|---|---|
| | | Specific Resistance before Irradiation of Light with Wavelength of Shorter than 400 nm (Ω cm) | Film Thickness (μm) | Resolution (μm) | Transmittance (%) | Specific Resistance after Irradiation of Light with Wavelength of Shorter than 400 nm (Ω cm) |
| Example 10 | 6.75 | 2.2E-1 | 0.20 | 20L&S | 85 or higher | 9.5E-3 |
| Example 11 | 6.20 | 2.5E-1 | 0.18 | 30L&S | 85 or higher | 1.9E-2 |
| Example 12 | 6.52 | 2.8E-1 | 0.17 | 20L&S | 85 or higher | 2.5E-2 |
| Example 13 | 6.62 | 3.2E-1 | 0.19 | 20L&S | 85 or higher | 1.2E-2 |
| Example 14 | 4.32 | 4.9E-1 | 0.12 | 30L&S | 85 or higher | 3.2E-2 |
| Example 15 | 6.75 | 2.1E-1 | 0.23 | 30L&S | 85 or higher | 2.5E-2 |
| Example 16 | 6.75 | 3.6E-1 | 0.21 | 20L&S | 85 or higher | 3.1E-2 |
| Example 17 | 6.68 | 3.1E-1 | 0.23 | 30L&S | 85 or higher | 1.5E-2 |
| Example 18 | 8.98 | 6.2E-1 | 0.21 | — | 85 or higher | 2.2E-3 | pointed out in recent years. For these reasons, it has been demanded to modify or improve the properties of the thin films by any treatment during post-treatment process. However, it is the current situation that effective post-treatment methods have not been found out so far except post-annealing treatment.

However, according to the present invention, as will be shown by the following Examples, it is possible to increase the residual polarizations of ferroelectric thin films without changing the crystallinity thereof, by applying electromagnetic waves with wavelengths of 400 nm or shorter to the thin films.

1. Preparation of Ti—Pb Complex Solution

A 1,000 ml three-necked flask equipped with a mechanical stirrer, a Dimroth condenser, a thermometer, and silicone rubber stoppers was prepared. The flask was unstoppered, and 3.2 mol of acetic acid was placed in the flask.

0.04 mol of titanium oxide powder (purity: 99.99%) was added to the flask with stirring the acetic acid contained in the flask, and the temperature of the mixture was raised, with stirring, to 100° C. over a period of 30 minutes by using an oil bath. The mixture was heated under reflux at the temperature for 8 hours, and then cooled to room temperature.

The above solution contained in the flask was transferred to a 500 ml egg-plant type flask, and concentrated to 48.3 g by using a rotary evaporator at a temperature of 70° C. under a pressure of 30 mmHg. This concentrate was transferred to a 1,000 ml three-necked flask equipped with a mechanical stirrer, a Dimroth condenser, a thermometer and silicone rubber stoppers, and stirred at room temperature.

In a 100 ml Erlenmeyer flask, 0.92 mol of dimethylformamide (guaranteed reagent) and 0.06 mol of triethanolamine (guaranteed reagent) were placed, and the mixture was stirred by a stirrer for approximately 20 minutes to obtain a homogeneous solution.

This solution was added to the above-described condensate contained in the three-necked flask, and the temperature of the mixture was raised, with stirring, to 120° C. over a period of 30 minutes by using an oil bath. The mixture was heated under reflux at the temperature for 2 hours, and then cooled to room temperature, thereby obtaining a Ti complex solution consisting of Ti ion, acetic acid and triethanolamine.

To this solution, a Pb-i-propoxide/propanol solution (Pb content: 0.04 mol) was gradually added, with stirring, through the silicone rubber stopper by using a microsyringe. The temperature of the mixture was then raised, with stirring, to 120° C. over a period of 30 minutes by using an oil bath. The mixture was heated under reflux at the temperature for 1 hour, and then cooled to room temperature. Thus, a Ti—Pb complex solution of the present invention, consisting of Pb ion, Ti ion, acetic acid and triethanolamine was obtained. The Ti—Pb complex solution was transferred to a 300 ml egg-plant type flask. In a darkroom, a photosensitive polymer solution ("NPR-9100" manufactured by Nagase Electron Chemicals Co., Ltd., Japan, viscosity=640 cp) was added to the complex solution so that the weight ratio of the Ti—Pb complex solution to the photosensitive polymer solution would be 3:1, and the mixture was stirred at room temperature for 30 minutes. The resulting solution was filtered through a membrane filter with a pore size of 0.1 µm. Thus, a photosensitive Ti—Pb complex solution of the present invention was obtained.

2. Method for Forming Finely-Patterned Ferroelectric Thin Film

The photosensitive Ti—Pb complex solution of the present invention prepared in the above-described manner was spin-coated at 700 rpm for 30 seconds onto the surface of a substrate, which had been prepared by plating a 1.1 mm thick silicon wafer with an alloy of Pt and Ni, in such an amount that a film having a predetermined thickness would be formed. The film formed was preliminarily dried in a circulating clean oven at 100° C. for 20 minutes. After this preliminary drying, the film was covered with a mask having a resolution test pattern, and exposed to ultraviolet light (main peak wavelength: 405 nm) emitted from an ultraviolet irradiation device under the following conditions: the exposure energy was 31 mW/cm$^2$, and the exposure time was 50 seconds. The exposed film was then dipped in an aqueous solution containing 0.5% by weight of potassium hydroxide for 2 minutes for development.

The developed film was thoroughly washed with water, and then air-dried. The dried film was baked in an electric oven with keeping the peak temperature of 580° C. for 30 minutes. The substrate with a finely-patterned ferroelectric thin film (PbTiO3, hereinafter referred to as lead titanate film) was thus finally obtained.

Example 20

By the use of the Ti—Pb complex solution prepared in Example 19, a non-patterned ferroelectric thin film was formed on the substrate.

Example 21

The substrate on which a ferroelectric thin film had been formed in the same manner as in Example 19 was irradiated with electromagnetic wave (wavelength: 308 nm) by using Xe—Cl excimer laser at room temperature under atmospheric pressure, thereby preparing a sample. At this time, the irradiation energy was as shown in Table 3.

Comparative Example 1

The substrate on which a ferroelectric thin film had been formed in the same manner as in Example 19 was irradiated with electromagnetic wave (wavelength: 633 nm) by using He—Ne laser at room temperature under atmospheric pressure, thereby preparing a comparative sample. At this time, the irradiation energy was as shown in Table 3.

Comparative Example 2

The substrate on which a ferroelectric thin film had been formed in the same manner as in Example 19 leas heat-treated at 500° C. for 1 hour, thereby preparing a comparative sample.

3. Evaluation of Ferroelectric Thin Films

The samples obtained in Examples 19 to 21 and Comparative Examples 1 and 2 were evaluated by the following methods in terms of the crystallinity of PbTiO3 film and D-E hysteresis properties (evaluation of residual polarization Pr). The results are shown in Table 3.

METHOD FOR EVALUATING CRYSTALLINITY

The half band widths of the diffraction peaks of the faces (110) and (101) of PbTiO3 of perovskite structure were determined by X-ray diffractometry. The crystallinity was evaluated by comparing these half band widths with those obtained by using the sample of Example 1.

METHOD FOR MEASURING RESIDUAL POLARIZABILITY Pr

A D-E hysteresis curve was obtained by using a Pt—Ni electrode, and the residual polarization Pr was determined from this loop.

TABLE 3

| Sample | Laser Irradiation Energy (mJ/cm$^2$) | Change in Crystallinity | Rapid Polarization ($\mu$C/cm$^2$) |
| --- | --- | --- | --- |
| Example 19 | — | — | 21 |
| Example 20 | — | — | 22 |
| Example 21 | 150 | unchanged | 53 |
| Comp. Example 1 | 150 | unchanged | 22 |
| Comp. Example 2 | — | improved in crystallinity | 23 |

As shown in Table 3, the residual polarizations Pr of the samples of Examples 19 and 20 were from 21 to 22 $\mu$C/cm$^2$. These samples thus showed excellent properties as ferroelectric thin films. On the other hand, the sample of Example 21, which had been irradiated with electromagnetic wave with a wavelength shorter than 400 nm, showed a residual polarization of 53 $\mu$C/cm$^2$ greater than those of the samples of Examples 19 and 20, which had been irradiated with neither electromagnetic wave nor heat. The sample of Example 21 thus showed more excellent properties. Further, the crystallinity of the sample of Example 21 was the same as that of the sample of Example 19 or 20. It is therefore considered that high residual polarization was obtained due to a change in the configuration of the film. In contrast to this, the residual polarization of the sample of Comparative Example 1, which had been irradiated with electromagnetic wave with a wavelength longer than 400 nm, was not higher than that of the sample before being irradiated with the electromagnetic wave.

On the other hand, the sample of Comparative Example 2, obtained by heat-treating the sample of Example 19 was found to have crystallinity higher than that of the sample of Example 19. However, the residual polarization of the sample of Comparative Example 2 was only slightly higher than that of the sample of Example 19.

EXAMPLES OF FERROMAGNETIC THIN FILMS

Ferromagnetic thin films have conventionally been used as thin film head materials or recording materials, and are being used as these materials even now. As processes for forming such ferromagnetic thin films, sputtering process, coating process and the like are generally known. By these processes, ferromagnetic thin films having properties good for practical use have been produced. On the other hand, with changes in the social structure and the growth of information industry, the requirements for the recording density properties of ferromagnetic materials to be used as information-recording materials are getting severer year after year. In order to improve the recording density properties, it is important to control magnetic properties, especially coercive force. As thin film magnetic head materials, ferrite materials of spinel structure having low coercive forces, the magnetic hysteresis losses thereof being small, have conventionally been used in order to attain high-density recording. However, due to the aforementioned circumstances, it is strongly demanded to make coercive force lower. To attain this, it is important to design a material as follows: grain boundaries of crystals, by which coercive force is generated, in a magnetic material are decreased so that magnetic walls can easily move in low magnetic fields. Such a design can be made by making studies on methods and conditions for forming films of ferromagnetic materials. However, the methods for forming the films are accompanied by severe condition control, so that a simple post-treatment process is demanded.

According to the present invention, as will be shown in the following Examples, it is possible to decrease the coercive forces of ferromagnetic thin films without changing the crystallinity thereof, by applying electromagnetic waves with wavelengths of 400 nm or shorter to the thin films.

Example 22

1. Preparation of Fe—Zn Complex Solution

A 1,000 ml three-necked flask equipped with a mechanical stirrer, a Dimroth condenser, a thermometer, and silicone rubber stoppers was prepared. The flask was unstoppered, and 3.2 mol of acetic acid was placed in the flask.

0.04 mol of ferric oxide powder (purity: 99.99%) was added to the flask with stirring the acetic acid in the flask, and the temperature of the mixture was raised, with stirring, to 100° C. over a period of 30 minutes by using an oil bath. The mixture was heated under reflux at the temperature for 48 hours, and then cooled to room temperature.

The above solution contained in the flask was transferred to a 500 ml egg-plant type flask, and concentrated to 51.3 g by using a rotary evaporator at a temperature of 70° C. under a pressure of 30 mmHg.

This concentrate was transferred to a 1,000 ml three-necked flask equipped with a mechanical stirrer, a Dimroth condenser, a thermometer and silicone rubber stoppers, and stirred at room temperature. In a 100 ml Erlenmeyer flask, 0.92 mol of dimethylformamide (guaranteed reagent) and 0.12 mol of triethanolamine (guaranteed reagent) were placed, and the mixture was stirred by a stirrer for approximately 20 minutes to obtain a homogeneous solution.

This solution was added to the above-described condensate contained in the three-necked flask, and the temperature of the mixture was raised, with stirring, to 120° C. over a period of 30 minutes by using an oil bath. The mixture was heated under reflux at the temperature for 2 hours, and then cooled to 40° C., thereby obtaining a Fe complex solution consisting of Fe ion, acetic acid and triethanolamine.

To this solution, a Zn-i-propoxide/propanol solution (Zn content: 0.04 mol) was gradually added, with stirring, through the silicone rubber stopper by using a microsyringe. The temperature of the mixture was then raised, with stirring, to 120° C. over a period of 30 minutes by using an oil bath. The mixture was heated under reflux at the temperature for 1 hour, and then cooled to room temperature. Thus, a Fe—Zn complex solution of the present invention, consisting of Zn ion, Fe ion, acetic acid and triethanolamine was obtained. The Fe—Zn complex solution was transferred to a 300 ml egg-plant type flask. In a darkroom, a photosensitive polymer solution ("NPR-9100" manufactured by Nagase Electron Chemicals Co., Ltd., Japan, viscosity=640 cp) was added to the complex solution so that the weight ratio of the Ti—Pb complex solution to the photosensitive polymer solution would be 3:1, and the mixture was stirred at room temperature for 30 minutes. The resulting solution was filtered through a membrane filter with a pore size of 0.1 $\mu$m. Thus, a photosensitive Fe—Zn complex solution of the present invention was obtained.

2. Method for Forming Finely-Patterned Ferromagnetic Thin Film

The photosensitive Fe—Zn complex solution of the present invention prepared in the above-described manner was spin-coated at 700 rpm for 30 seconds onto the surface of a 1.1 mm thick glass substrate in such an amount that a film having a predetermined thickness would be formed. The film formed was preliminarily dried in a circulating clean oven at 100° C. for 20 minutes. After this preliminary drying, the film was covered with a mask having a resolution test pattern, and exposed to ultraviolet light emitted from an ultraviolet irradiation device (main peak wavelength: 405 nm) under the following conditions: the exposure energy was 31 mW/cm$^2$, and the exposure time was 50 seconds. The exposed film was then dipped in an aqueous solution containing 0.5% by weight of potassium hydroxide for 2 minutes for development. The developed film was thoroughly washed with water, and then air-dried. The dried film was baked in an electric oven with keeping the peak temperature of 580° C. for 30 minutes. The substrate with a finely-patterned ferromagnetic thin film (ZnO.Fe$_2$O$_3$, hereinafter referred to as ferrite film) was thus finally obtained.

Example 23

By the use of the Fe—Zn complex solution prepared in Example 22, a non-patterned ferromagnetic thin film was formed on the substrate.

Example 24

The substrate on which a ferromagnetic thin film had been formed in the same manner as in Example 22 was irradiated with electromagnetic wave (wavelength: 308 nm) by using Xe—Cl excimer laser at room temperature under atmospheric pressure, thereby obtaining a sample. At this time, the irradiation energy was as shown in Table 4.

COMPARATIVE EXAMPLE 3

The substrate on which a ferromagnetic thin film had been formed in the same manner as in Example 22 was irradiated with electromagnetic wave (wavelength: 633 nm) by using He—Ne excimer laser at room temperature under atmospheric pressure, thereby obtaining a comparative sample. At this time, the irradiation energy was as shown in Table 4.

COMPARATIVE EXAMPLE 4

The substrate on which a ferromagnetic thin film had been formed in the same manner as in Example 22 was heat-treated at 500° C. for 1 hour, thereby obtaining a comparative sample.

3. Evaluation of Ferromagnetic Thin Films

The samples obtained in Examples 22 to 24 and Comparative Examples 3 and 4 were evaluated by the following methods in terms of the crystallinity of ferrite film and magnetic hysteresis properties (evaluation of coercive force Hc). The results are shown in Table 4.

METHOD FOR EVALUATING CRYSTALLINITY

The half band widths of the diffraction peaks of the faces (111) and (110) of the ferrite of spinel structure were determined by X-ray diffractometry. The crystallinity was evaluated by comparing these half band widths with those obtained by using the sample D.

Judged that crystallinity is improved when the half band widths of the faces (111) and (110) are decreased.

Judged that crystallinity is lowered when the half band widths of the faces (111) and (110) are increased.

METHOD FOR MEASURING COERCIVE FORCE Hc

A magnetic hysteresis curve of the sample was obtained by using a vibration sample magnetometer (VSM), and the coercive force Hc was determined by this loop.

TABLE 4

| Sample | Laser Irradiation Energy (mJ/cm$^2$) | Change in Crystallinity | Coercive Force (mOe) |
|---|---|---|---|
| Example 22 | — | — | 200 |
| Example 23 | — | — | 195 |
| Example 24 | 250 | unchanged | 15 |
| Comp. Example 3 | 250 | unchanged | 205 |
| Comp. Example 4 | — | improved in crystallinity | 190 |

As shown in Table 4, the coercive forces of the samples of Examples 22 and 23 were from 195 to 205 mOe. These samples thus showed excellent properties as ferromagnetic thin films to be used as thin film magnetic head materials. On the other hand, the sample of Example 24 prepared by the application of electromagnetic wave with a wavelength of shorter than 400 nm showed a coercive force lower than those of the samples of Examples 22 and 23, to which neither electromagnetic wave nor heat had been applied. Thus, this sample showed more excellent properties. Further, the crystallinity of the sample of Example 24 was the same as that of the sample of Example 22 or 23. It is therefore considered that the sample of Example 24 showed a lowered coercive force because grain boundaries of crystals in the sample of Example 22 were decreased due to a change in the configuration of the film. In contrast to this, the sample of Comparative Example 3 prepared by the application of electromagnetic wave with a wavelength of longer than 400 nm showed almost the same coercive force as those of the samples of Examples 22 and 23.

On the other hand, the sample of Comparative Example 24 obtained by applying heat to the sample of Example 22 showed crystallinity higher than that of the sample of Example 22. However, the coercive force of this comparative sample was only slightly lower than that of the sample of Example 22.

As explained above, according to the present invention, it is possible to provide metal complex solutions or photosensitive metal complex solutions with which metallic oxide films, or ITO films having low electrical resistance and high transparency can be formed on substrates by a method of application utilizing the so-called sol-gel process, and a method for forming metallic oxide films, particularly transparent conducting films, using these solutions.

Films formed with the metal complex solutions or photosensitive metal complex solutions of the present invention are useful as antistatic materials, materials for heat ray cut-off filters, materials for ultraviolet light cut-off filters, electromagnetic-wave-shielding materials, metallic oxide films or transparent electrode materials to be used for liquid crystal displays, plasma displays, etc., and materials for producing deicing heaters for window glasses or the like.

What is claimed is:

1. A method for forming a ferroelectric or ferromagnetic metallic oxide film, said method comprising the steps of:

coating a substrate with a ferroelectric or ferromagnetic metal complex solution comprising an organic solvent and a complex dissolved in said organic solvent, said ferroelectric or ferromagnetic metal complex comprising an organic acid salt of at least one ferroelectric or ferromagnetic metal and an organic amine or an organic ketone compound;

drying the coating thus formed on said substrate to form a ferroelectric or ferromagnetic metal complex film;

baking the ferroelectric or ferromagnetic metal complex film at 300° C. to 600° C. to obtain a ferroelectric or ferromagnetic metallic oxide film; and irradiating the ferroelectric or ferromagnetic metallic oxide film with light having a wavelength of not more than 400 nm to increase residual polarization or to decrease coercive force without changing the crystallinity thereof.

2. A method according to claim 1, wherein the complex comprises an organic acid salt of at least one metal and an organic amine, the organic amine being elected from the group consisting of monoethanolamine, diethanolamine, triethanolamine, triethylamine, propylamine, diethylamine and trimethylamine.

3. A method according to claim 1, wherein the complex comprises an organic acid salt of at least one metal and an organic ketone compound, the organic ketone compound being a β-ketone compound.

* * * * *